(12) United States Patent
Taylor

(10) Patent No.: US 12,704,557 B2
(45) Date of Patent: Aug. 11, 2026

(54) SYSTEM AND METHODS FOR DETERMINING A STATUS OF AN ELECTROCHEMICAL ENERGY STORAGE DEVICE

(71) Applicant: Cox Automotive, Inc., Atlanta, GA (US)

(72) Inventor: Connor Benjamin Taylor, Norman, OK (US)

(73) Assignee: Cox Automotive, Inc., Atlanta, GA (US)

( * ) Notice: Subject to any disclaimer, the term of this patent is extended or adjusted under 35 U.S.C. 154(b) by 130 days.

(21) Appl. No.: 18/621,494

(22) Filed: Mar. 29, 2024

(65) Prior Publication Data

US 2025/0306116 A1 Oct. 2, 2025

(51) Int. Cl.
*G01R 31/389* (2019.01)
*H01M 10/54* (2006.01)

(52) U.S. Cl.
CPC .......... *G01R 31/389* (2019.01); *H01M 10/54* (2013.01)

(58) Field of Classification Search
None
See application file for complete search history.

(56) References Cited

U.S. PATENT DOCUMENTS

| | | | | |
|---|---|---|---|---|
| 2012/0019253 | A1 | 1/2012 | Ziegler et al. | |
| 2019/0296403 | A1* | 9/2019 | Ballantine | H02J 7/0047 |
| 2022/0311063 | A1* | 9/2022 | Izumi | H02J 7/0013 |
| 2023/0031969 | A1* | 2/2023 | Hill | G01R 27/28 |

FOREIGN PATENT DOCUMENTS

CA 3231626 A1 3/2023

OTHER PUBLICATIONS

Notification of Transmittal of the International Search Report and the written Opinion issued in International Patent Application No. PCT/US2025/022164 mailed Jul. 28, 2025 (15 pages).

Kim Seon Hyeog et al: "Aging Monitoring Method for Lithium-Ion Batteries Using Harmonic Analysis", IEEE Transactions on Instrumentation and Measurement, IEEE, USA, vol. 70, Dec. 7, 2020 (Dec. 7, 2020), pp. 1-11, XP011827175, ISSN: 0018-9456, DOI: 10.1109/TIM.2020.3043097 [retrieved on Dec. 24, 2020].

* cited by examiner

*Primary Examiner* — Jas A Sanghera
(74) *Attorney, Agent, or Firm* — Merchant & Gould P.C.

(57) ABSTRACT

Methods and systems for determining a status of an electrochemical energy storage device is provided. An impedance profile of an electrochemical energy storage device is determined using an Electrochemical Impedance Spectroscopy (EIS) device. The determined impedance profile is compared with a predetermined impedance profile. A status of the electrochemical energy storage device is determined based on the comparison.

18 Claims, 8 Drawing Sheets

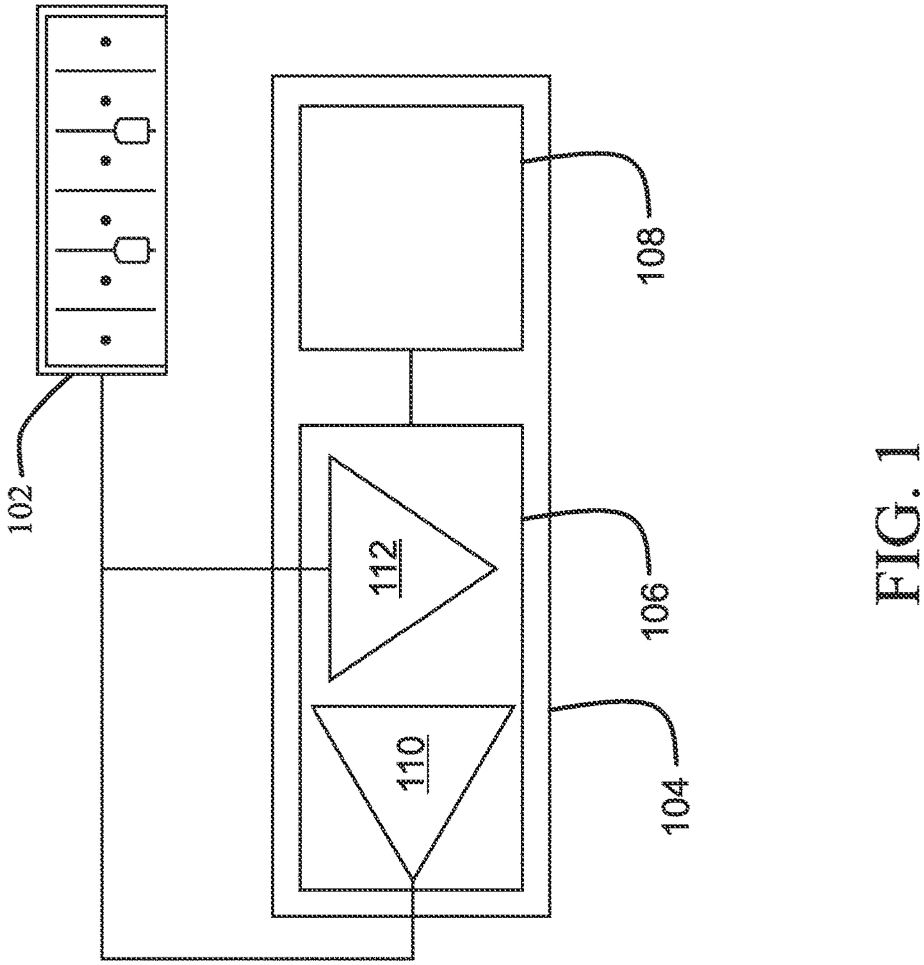
FIG. 1
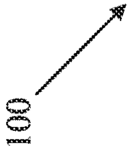

SYSTEM AND METHODS FOR DETERMINING A STATUS OF AN ELECTROCHEMICAL ENERGY STORAGE DEVICE

BACKGROUND

Environmental impact of non-renewable energy sources such as coal, petroleum, natural gas, and the like has led to an increased popularity of electric vehicles and hybrid-electric vehicles among the general population. Further, renewable energy sources such as solar power, wind power, hydro-electric power, geothermal power, and the like are also gaining a strong foothold in the energy sector. Electric and hybrid-electric vehicles, wind power systems, electric grids, as well as solar power systems typically employ electrochemical devices for storing energy for later consumption. The electrochemical devices are also employed in devices such as household appliances, medical device, power tools, consumer electronics, and the like.

Electrochemical devices, for example, a rechargeable battery, a storage battery, a secondary cell, or an accumulator is a type of electrical battery that can be charged, discharged into a load, and recharged many times. Rechargeable batteries are produced in many different shapes and sizes, ranging from button cells to megawatt systems connected to stabilize an electrical distribution network. Several different combinations of electrode materials and electrolytes are used, including lead-acid, nickel cadmium (NiCd), nickel metal hydride (NiMH), lithium ion (Li-ion), and lithium ion polymer (Li-ion polymer).

Emerging applications of rechargeable batteries in hybrid internal combustion-battery and electric vehicles are driving the technology to reduce cost, weight, size, and increase lifetime. The rechargeable batteries used in the automotive industry are sometimes recalled or swapped out by automotive dealers. Not all recalled and swapped out rechargeable batteries are degraded. Therefore, these rechargeable batteries are tested to determine a level of degradation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 1 is a diagram of An Energy Storage System (ESS).

DETAILED DESCRIPTION

Figure 2:
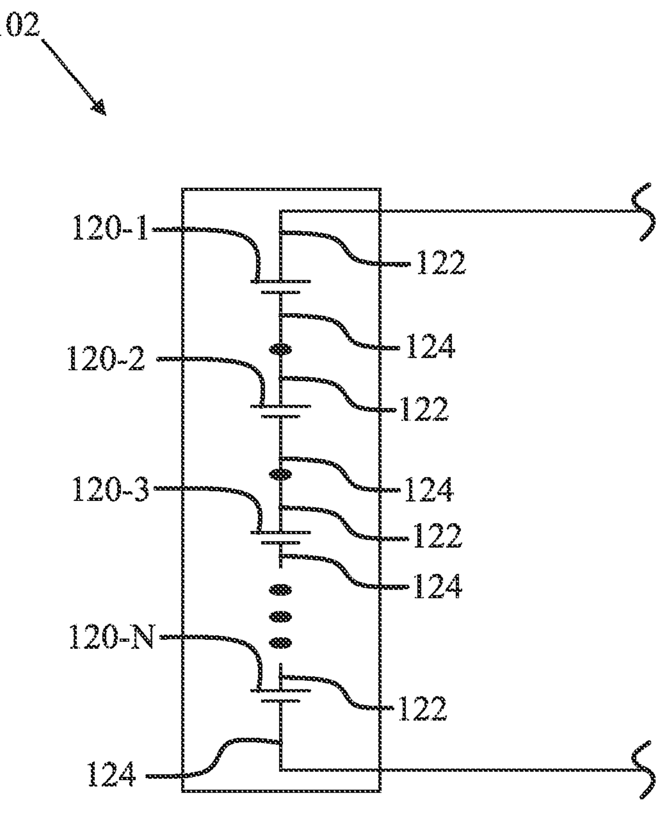
FIG. 2 is a diagram illustrating battery modules of a battery pack.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Electrochemical devices, for example, a rechargeable battery, a storage battery, a secondary cell, or an accumulator is a type of electrical battery that can be charged, discharged into a load, and recharged many times. Embodiments of the disclosure provides methods and systems for determining a status of rechargeable batteries. Disclosed techniques may enable faster determination of whether a rechargeable battery is degraded or not.

FIG. 1 is a block diagram of a system 100 for determining status of a rechargeable battery. As shown in FIG. 1, system 100 includes a battery pack 102 and a status detector 104. Status detector 104 determines a status of battery pack 102. That is, status detector 104 determines whether battery pack 102 is degraded or not.

Status detector 104 includes an Electrochemical Impedance Spectroscopy (EIS) device 106 and an impedance detector 108. EIS device 106 includes a signal generator 110 and a signal detector 112. Signal generator 110 generates one or more variable current or voltage signals that are injected into battery pack 102. Signal detector 112 detects a corresponding voltage or current signals from battery pack 102 in response to the injected variable current or voltage signals. Impedance detector 108 determines an impedance of battery pack 102 from the detected corresponding voltage or current signals. Based on the determined impedance, status detector 104 determines whether battery pack 102 is degraded or not.

Battery pack 102 is an electrochemical energy storage device, for example, a rechargeable battery. Battery pack 102 stores energy for later consumption. Battery pack 102 may include a plurality of battery modules connected together. In examples, a battery module may be the smallest unit of battery pack 102 without breaking any permanent mechanical systems. In some embodiments, these battery modules may be manufactured for or recovered from one or more battery packs of a vehicle, for example, an electric vehicle.

FIG. 2 illustrates an example battery pack 102. As shown in FIG. 2, battery pack 102 may include a plurality of battery modules, for example, a first battery module 120-1, a second battery module 120-2, a third battery module 120-3, . . . , an Nth battery module 120-N connected together. It may be understood that battery pack 102 may include any number of battery modules. For example, battery pack 102 may include 2, 3, 4, 5, 10, 20, 30, or 40, battery modules.

Each of the plurality of battery modules have a positive terminal 122 and a negative terminal 124. The plurality of battery modules can be combined in a series configuration in which positive terminal 122 of one of the plurality of battery modules is connected to negative terminal 124 of an adjacent battery module. In some arrangement, one or more battery modules are connected in parallel while some battery modules are connected in series. A total capacity and voltage rating of battery pack 102 may depend on a number of battery modules included in battery pack 102 and the connection configuration of the battery modules.

In some examples, one or more fuses may divide battery pack 102 into two or more sections or groupings. Battery sections are generally composed of a plurality of modules and may be structured for ease in disassembly and reconstituted through the use of removable hardware (e.g., threaded rods with removable nuts). These structures may arise for two reasons. First is the requirement for mechanical compression which may be required for proper functioning. Second, intermediate electrical equipment, such as fuses and contactors, are positioned for safety and operation. For example, fuses are typically located mid-battery pack so that removal of the fuse reduces battery voltage by half.

Figure 3:
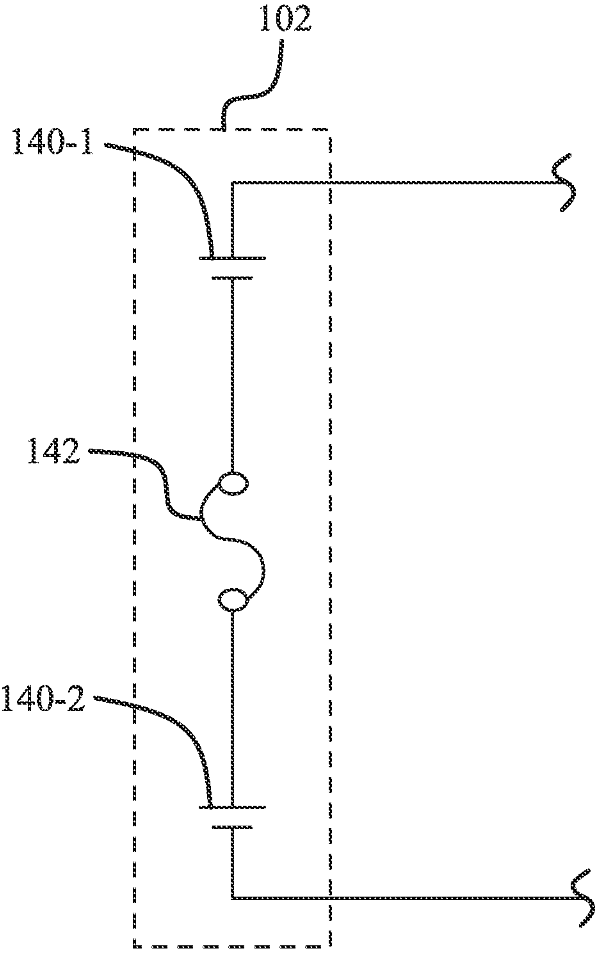
FIG. 3 is a diagram illustrating sections of a battery pack.

FIG. 3 is a diagram illustrating sections of battery pack 102. As shown in FIG. 3, battery pack 102 includes two sections, a first section 140-1 and a second section 140-2 connected by a fuse 142. Each of first section 140-1 and second section 140-2 may include multiple battery modules, for example, 2, 3, 4, 5, 10, 15, 20, 30, 40, etc. A number of battery modules in each of first section 140-1 and second section 140-2 may be the same or different depending on a design consideration of battery pack 102. In addition, battery pack 102 may include more than two modules and the modules do not have to be separated by fuse 142. Moreover, in some examples, if present, fuse 142 does not have to be between sections, and can be located anywhere along a current path. For example, fuse 142 can be located anywhere on exterior of battery pack 102 so that fuse 142 is more accessible by a user.

In accordance with example embodiments, EIS device 106 applies a variable voltage (e.g., a sinusoidal potential) or a variable current (e.g., a sinusoidal current) across battery pack 102 and measures a corresponding output current or a corresponding output potential respectively. The variable voltage or variable current applied by the EIS device may be an arbitrary waveform. When EIS device 106 applies a sinusoidal potential across battery pack 102 and measures the corresponding output current, then it is referred to as potentiostatic device. However, when EIS device 106 applies a sinusoidal current across battery pack 102 and measures the corresponding output potential, then it is referred to as galvanostatic device.

The sinusoidal potential that EIS device 106 applies across battery pack 102 has several attributes. For example, the sinusoidal potential is time dependent, that is, the applied potential fluctuates as a function of time. In addition, the sinusoidal potential has an amplitude (i.e., a size of the applied signal) and an angular frequency (i.e., how frequently the potential oscillates). Corresponding output current has similar attributes. For example, the corresponding output current is a time dependent current (i.e., it is a sinusoidal current having an amplitude that oscillates with time) and a same angular frequency of the applied sinusoidal potential. However, the output current's angular frequency is offset from the applied sinusoidal voltage. This offset is referred to as a phase shift or a phase angle.

Figure 4:
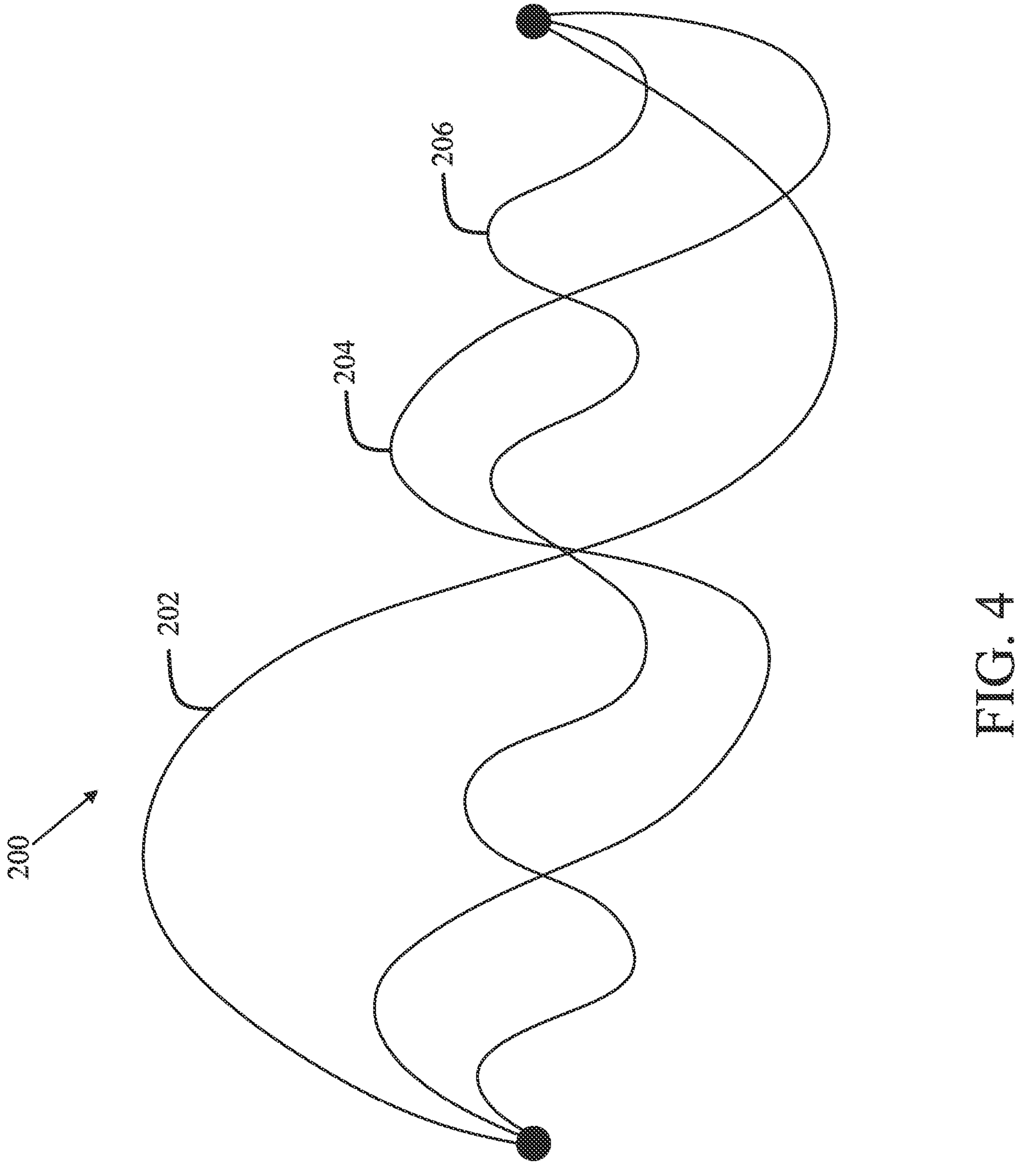
FIG. 4 is a graph illustrating sinusoidal potential signals of multiple frequencies.

EIS device 106 applies the sinusoidal potential across battery pack 102 at multiple frequencies substantially simultaneously. FIG. 4 is a graph 200 illustrating multiple frequencies at which the sinusoidal potential is applied across battery pack 102. As shown in FIG. 4, EIS device 106 applies the sinusoidal potential at a first frequency 202, a second frequency 204, and a third frequency 206. The first frequency 202 is smaller than second frequency 204. Second frequency 204 is smaller than third frequency 206. In some examples, first frequency 202 is 0.1 Hz, second frequency 204 is 0.2 Hz, and third frequency 206 is 0.4 Hz. In some examples, EIS device 106 may apply different potential signals at different frequencies or a same potential signal at different frequency. In some examples, EIS device 106 may generate a single waveform (also referred to as a composite potential waveform) by combining multiple sinusoidal waveforms at multiple frequencies. The composite potential waveform is then applied across battery pack 102.

Figure 5:
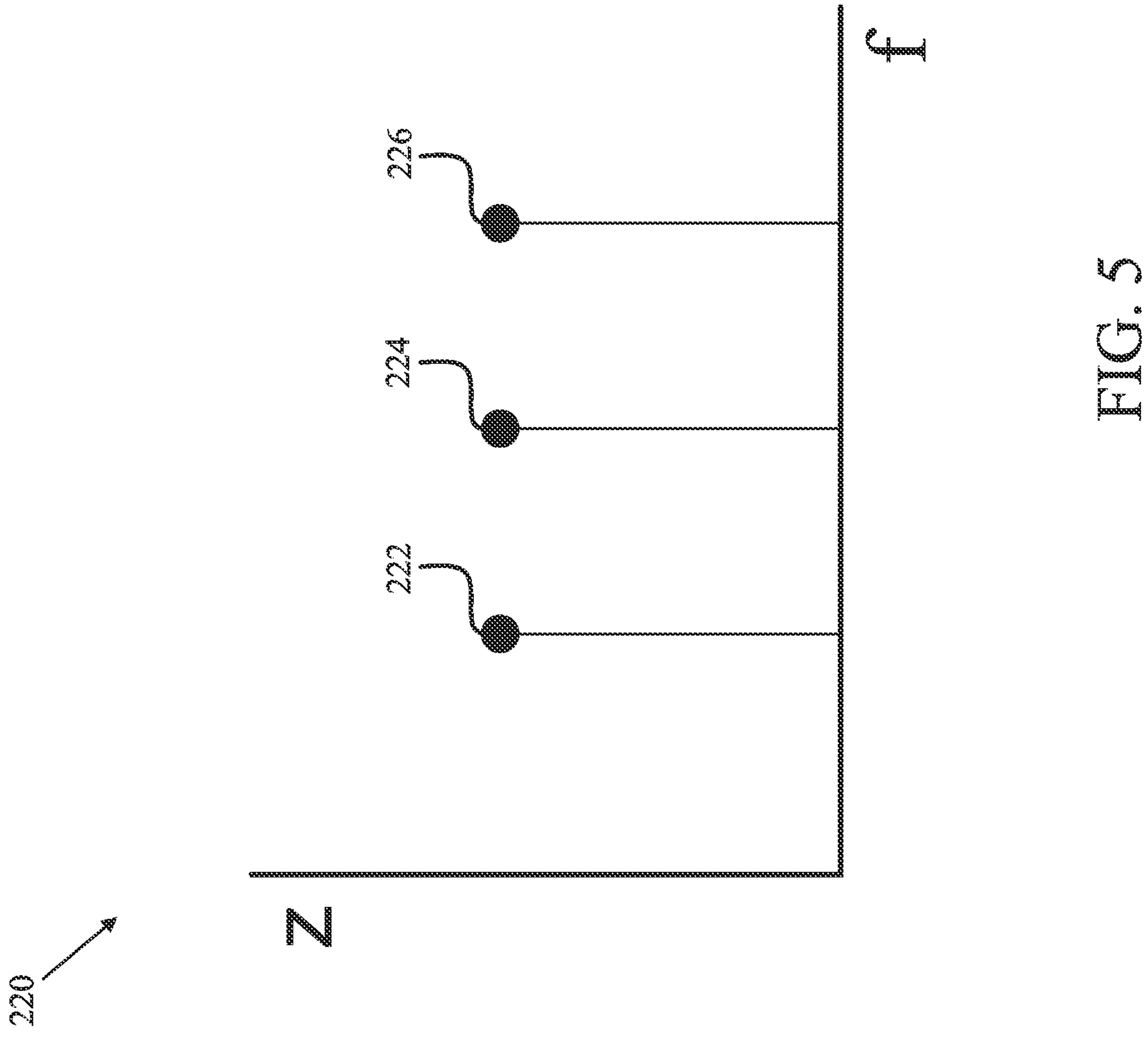
FIG. 5 is a graph illustrating frequency domain values of output currents corresponding to sinusoidal potential signals at the multiple frequencies.

EIS device 106 measures the corresponding output current at these multiple frequencies creating a spectrum. EIS device 106 then converts time domain signals (e.g., the sinusoidal potential and the corresponding output current) to frequency domain signals. That is, EIS device 106 determines a Fourier transform of the sinusoidal potentials and the corresponding output currents at these multiple frequencies. FIG. 5 is a graph 220 illustrating frequency domain values of corresponding output currents of the sinusoidal potential at the multiple frequencies. For example, a first value 222 corresponds to first frequency 202, a second value 224 corresponds to second frequency 204, and a third value 226 corresponds to third frequency 206. The internal impedance of battery pack 102 is then determined by dividing the frequency domain potential signal by the frequency domain output current signal.

An impedance profile of battery pack 102 is developed based on the determined internal resistance at multiple frequencies. The determined impedance profile is then compared with one or more predetermined impedance profiles. The predetermined impedance profiles may be generated with data from known healthy battery packs and known degraded battery packs. By comparing the determined impedance profile with the predetermined impedance profile, status detector 104 may determine whether battery pack is degraded or not degraded. For example, if the determined impedance profile of battery pack 102 is similar to a predetermined impedance profile corresponding to a healthy battery pack, then battery pack 102 is determined to be not degraded. In such example, if the determined impedance profile of battery pack 102 is not similar to the predetermined impedance profile corresponding to a healthy battery pack, then battery pack 102 is determined to be degraded. In another example, if the determined impedance profile of battery pack 102 is similar to a predetermined impedance profile corresponding to a degraded battery pack, then battery pack 102 is determined to be degraded. In such example, if the determined impedance profile of battery pack 102 is not similar to the predetermined impedance profile corresponding to a degraded battery pack, then battery pack 102 is determined to be not degraded.

Thus, applying the sinusoidal potential at multiple frequencies at the same time enables expedited testing of battery pack 102. That is, by applying the sinusoidal potentials at multiple frequencies at the same time enables status detector to determine an impedance profile of battery pack 102 in a single test rather than having to run multiple tests at single frequencies. In some examples, status detector 104 may determine status of each sections and each battery module of battery pack 102.

Figure 6:
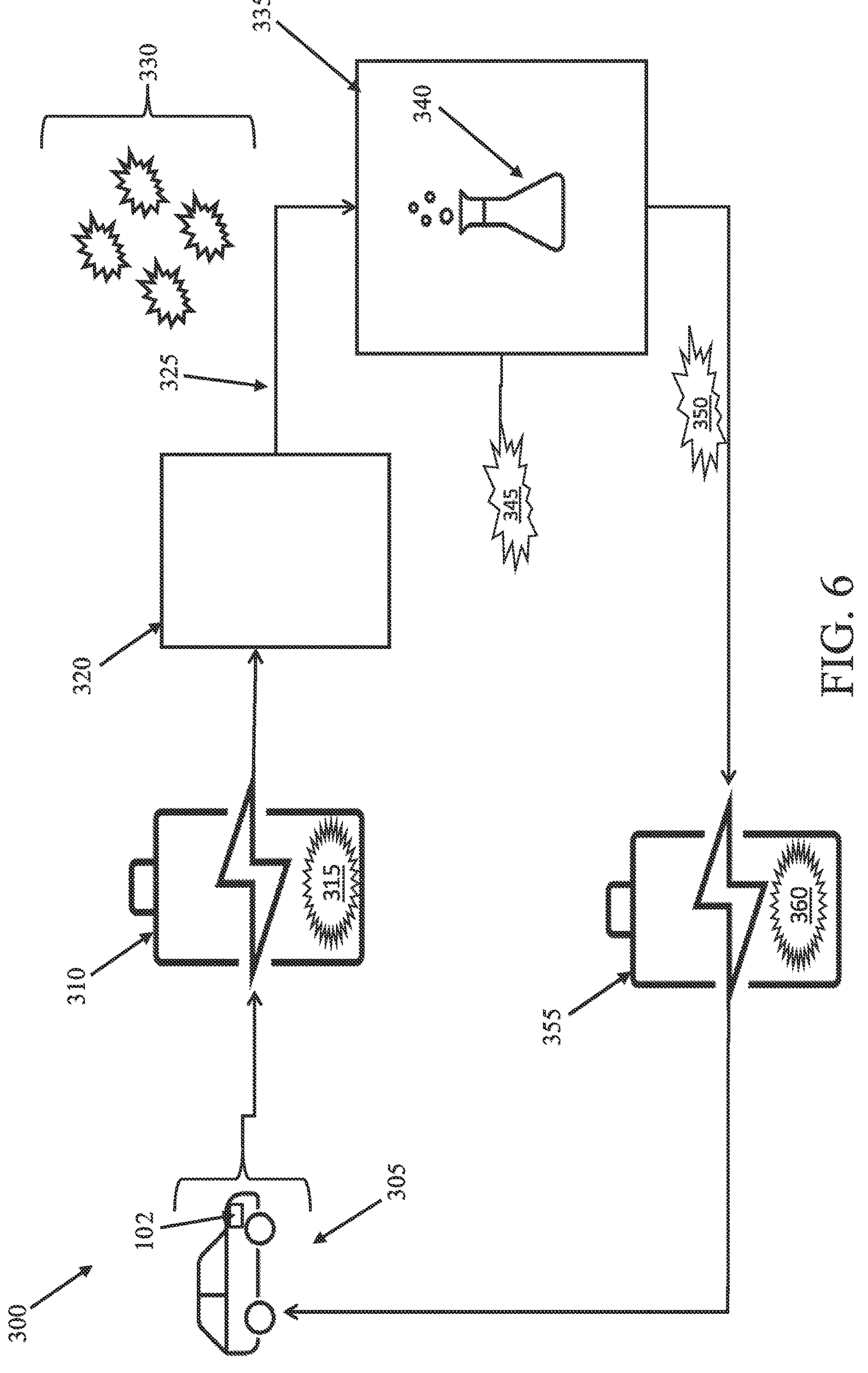
FIG. 6 is a diagram illustrating a battery recycling environment.

If battery pack 102 is determined to be not degraded beyond a certain threshold, then it can be reused. Similarly, if a section or a battery module of battery pack 102 is determined to be not degraded a certain threshold, then such section of the battery module may be reused. Battery pack 102, sections, or and modules that are degraded beyond a certain threshold are recycled. FIG. 6 is a block diagram illustrating a battery recycling environment 300.

Referring to FIG. 6, in battery recycling environment 300, battery pack 102 from automobiles 305 (hybrid and pure electric) and any other type of battery supported equipment is suitable for use with the disclosed approach. Battery pack 102 contribute spent cell 310 having anode and cathode material 315. Anode and cathode material 315 may include nickel, manganese, cobalt, lithium, graphite, etc. Discharge environment 320 completely discharges spent cell 310. A physical separation process 325 dismantles completely discharged spent cell 310 to form a granular mass 330. Granular mass 330 is formed usually by simply crushing and grinding the spent battery cashing and cells therein.

Physical separation is applied to remove the battery cases (plastic) and electrode materials, for example, via magnetic separation that draws out the magnetic steel. A recycler 335 includes physical containment of a solution 340 including granular mass 330 that includes the spent charge materials. Additional raw charge materials 345 may be added to achieve a predetermined ratio of the desirable materials in solution 340. Following the recycling process, cathode materials 350 result and are employed to form a new cell 355 including recycled cathode material 360. New cell 355 may then be employed to create another battery pack for automobile 305 or other various type of electronic devices.

The elements described above of system 100 (e.g., status detector 104) may be practiced in hardware and/or in software (including firmware, resident software, microcode, etc.) or in any other circuits or systems. The elements of system 100 may be practiced in electrical circuits comprising discrete electronic elements, packaged or integrated electronic chips containing logic gates, a circuit utilizing a microprocessor, or on a single chip containing electronic elements or microprocessors. Furthermore, the elements of system 100 may also be practiced using other technologies capable of performing logical operations such as, for example, AND, OR, and NOT, including but not limited to, mechanical, optical, fluidic, and quantum technologies. As described in greater detail below with respect to FIG. 8, the elements of system 100 may be practiced in a computing device 500.

Figure 8:
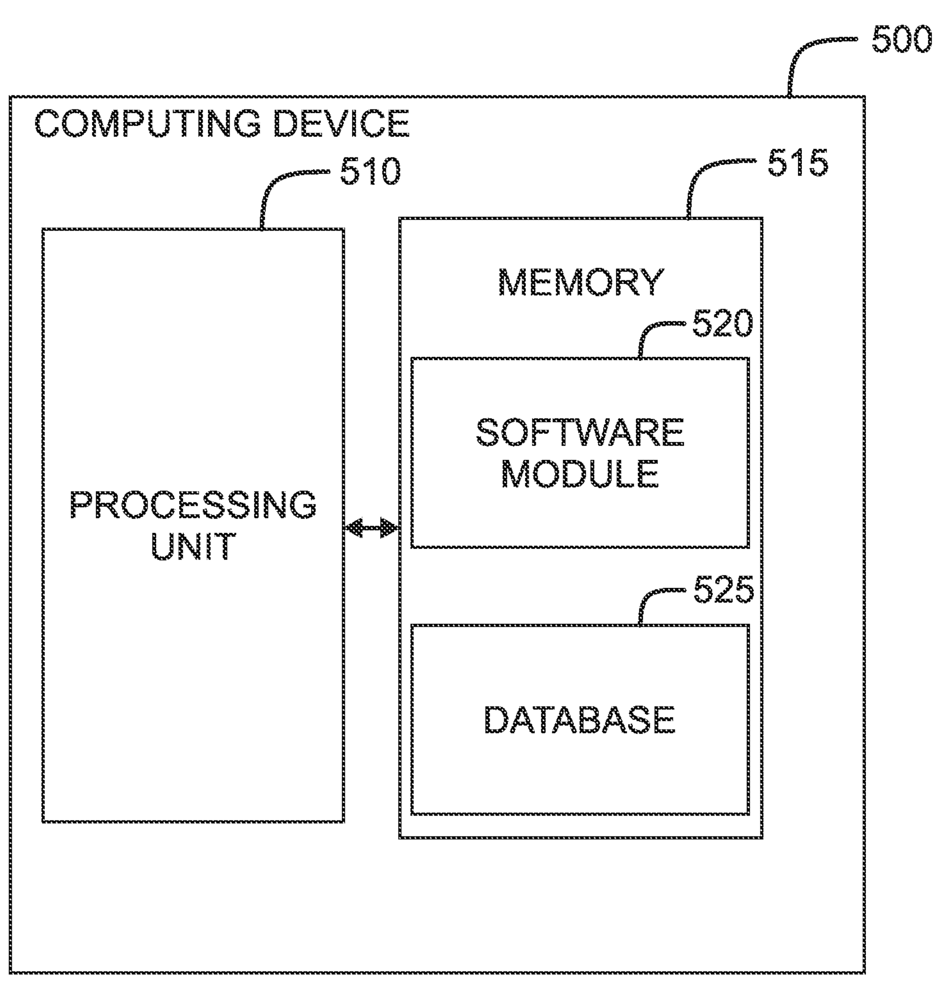
FIG. 8 is a block diagram of a computing device.

FIG. 8 is a flow chart setting forth the general stages involved in a method 400 consistent with an embodiment of the disclosure for determining a status of battery pack 102. Method 400 may be performed by status detector 104. Ways to implement the stages of method 400 will be described in greater detail below.

Method 400 begins at starting block 405 and proceeds to stage 410 where status detector 104 determines an impedance profile of an electrochemical energy storage device (that is, battery pack 102) using EIS device 106. For example, signal generator 110 applies a sinusoidal potential across the electrochemical energy storage device (that is, battery pack 102) at multiple frequencies. Signal detector 112 of EIS device 106 measures a corresponding output current at each of the multiple frequencies of the sinusoidal potential. Impedance detector 108 determines the impedance profile of the electrochemical energy storage device (that is, battery pack 102) based on the sinusoidal potential and the corresponding output current.

After determining the impedance profile at stage 410, method 400 proceeds to stage 420 where status detector 104 compares the impedance profile with a predetermined impedance profile. A plurality of predetermined impedance profiles may be pre-generated and provided to status detector 104. The plurality of impedance profiles may include a first impedance profile corresponding to a healthy battery pack, a second impedance profile corresponding to a degraded battery pack, etc.

Once having compared the impedance profile with the predetermined impedance profile at stage 420, method 400 proceeds to stage 430 where status detector 104 determines a status of the electrochemical energy storage device (that is, battery pack 102) based on the comparison. For example, status detector 104 determines the status of battery pack 102 to be not degraded when the determined impedance profile of battery pack 102 is similar to a predetermined impedance profile corresponding to a healthy battery pack. In such example, status detector 104 determines the status of battery pack 102 to be degraded when the determined impedance profile of battery pack 102 is not similar to the predetermined impedance profile corresponding to a healthy battery pack. In another example, status detector 104 determines the status of battery pack 102 to be degraded when the determined impedance profile of battery pack 102 is similar to a predetermined impedance profile corresponding to a degraded battery pack. In such example, status detector 104 determines the status of battery pack 102 to be not degraded when the determined impedance profile of battery pack 102 is not similar to the predetermined impedance profile corresponding to a degraded battery pack. After determining the status of the electrochemical energy storage device at stage 430, method 400 may terminate at end block 440.

Figure 7:
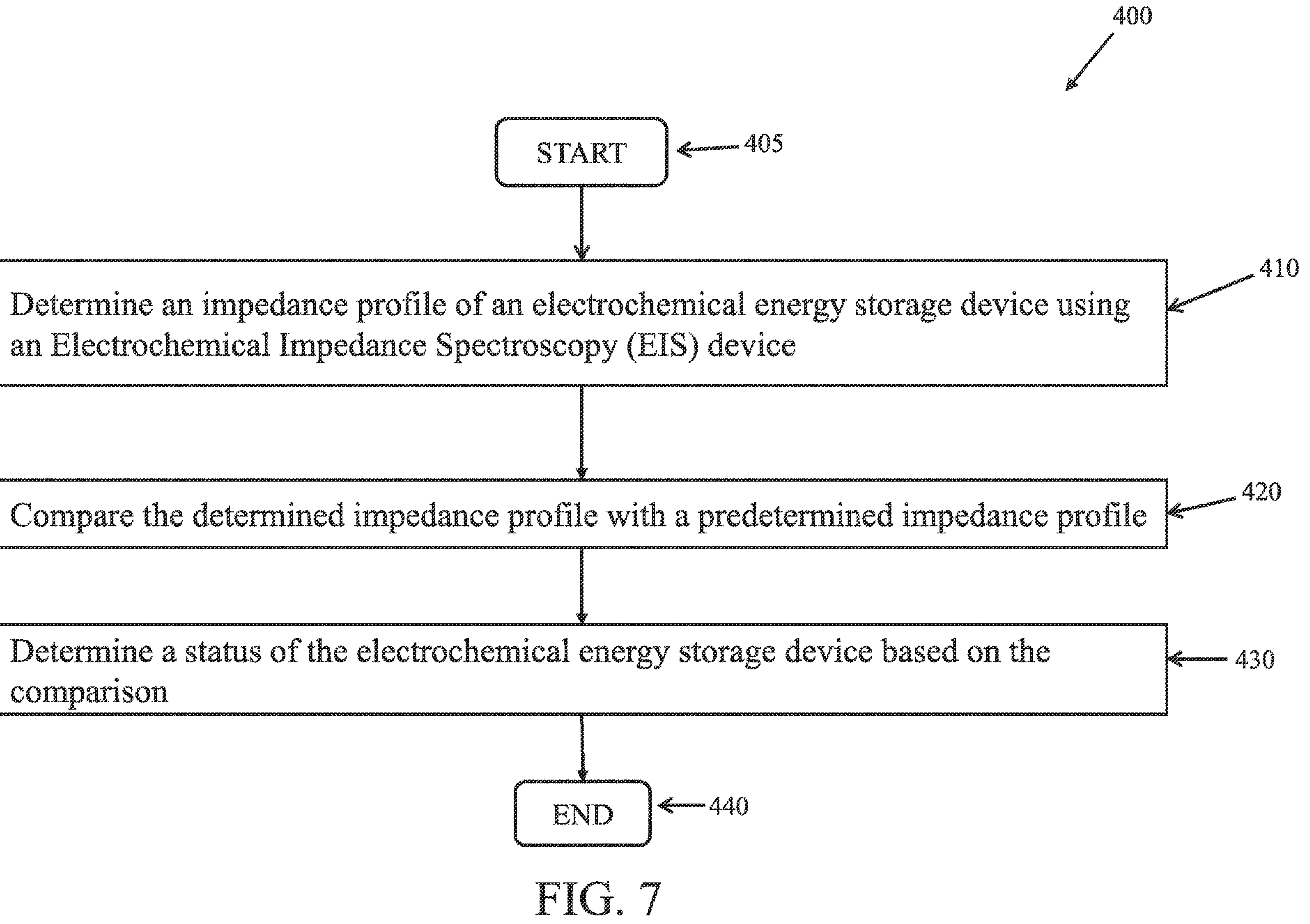
FIG. 7 is a flow diagram of a method of determining a status of an electrochemical energy storage device.

FIG. 9 shows computing device 500. As shown in FIG. 8, computing device 500 includes a processing unit 510 and a memory unit 515. Memory unit 515 includes a software module 520 and a database 525. While executing on processing unit 510, software module 520 performs, for example, processes for determining a status of battery pack 102, including for example, any one or more of the stages from method 400 described above with respect to FIG. 7. Computing device 500, for example, provides an operating environment for status detector 104. Status detector 104 may operate in other environments and are not limited to computing device 500.

Computing device 500 can be implemented using a tablet device, a mobile device, a smart phone, a telephone, a remote control device, a personal computer, a network computer, a mainframe, a router, a switch, a server cluster, a smart TV-like device, a network storage device, a network relay device, or other similar microcomputer-based device. Computing device 500 can include any computer operating environment, such as hand-held devices, multiprocessor systems, microprocessor-based or programmable sender electronic devices, minicomputers, mainframe computers, and the like. Computing device 500 can also be practiced in distributed computing environments where tasks are performed by remote processing devices. The aforementioned systems and devices are examples and computing device 500 can comprise other systems or devices.

Embodiments of the disclosure, for example, can be implemented as a computer process (method), a computing system, or as an article of manufacture, such as a computer program product or computer readable media. The computer program product can be a computer storage media readable by a computer system and encoding a computer program of instructions for executing a computer process. The computer program product can also be a propagated signal on a carrier readable by a computing system and encoding a computer program of instructions for executing a computer process. Accordingly, the present disclosure can be embodied in hardware and/or in software (including firmware, resident software, micro-code, etc.). In other words, embodiments of the present disclosure can take the form of a computer program product on a computer-usable or computer-readable storage medium having computer-usable or computer-readable program code embodied in the medium for use by or in connection with an instruction execution system. A computer-usable or computer-readable medium can be any medium that can contain, store, communicate, propagate, or transport the program for use by or in connection with the instruction execution system, apparatus, or device.

The computer-usable or computer-readable medium can be, for example but not limited to, an electronic, magnetic, optical, electromagnetic, infrared, or semiconductor system, apparatus, device, or propagation medium. More specific computer-readable medium examples (a non-exhaustive list), the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the element illustrated in FIGS. 1-6 may be integrated onto a single integrated circuit. Such a SOC device may include one or more processing units, graphics units, communications units, system virtualization units and various application functionality all of which may be integrated (or "burned") onto the chip substrate as a single integrated circuit. When operating via a SOC, the functionality described herein with respect to embodiments of the disclosure, may be performed via application-specific logic integrated with other components of computing device 500 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:

determining an impedance profile of an electrochemical energy storage device using an Electrochemical Impedance Spectroscopy (EIS) device, wherein determining the impedance profile using the EIS device comprises:

generating, by the EIS device, a composite potential waveform comprising a combination of a plurality of sinusoidal potential waveforms at multiple different frequencies, applying, by the EIS device, the composite potential waveform across the electrochemical energy storage device, wherein the plurality of sinusoidal potential waveforms are applied simultaneously through the composite potential waveform, measuring, by the EIS device, a corresponding output current at each of the multiple different frequencies resulting from the plurality of sinusoidal potential waveforms, determining, by the EIS device, an impedance of the electrochemical energy storage device at each of the multiple different frequencies from the plurality of sinusoidal potential waveforms and the corresponding output current, and determining the impedance profile comprising the impedance of the electrochemical energy storage device at each of the multiple different frequencies;

comparing the determined impedance profile with a predetermined impedance profile; and determining a status of the electrochemical energy storage device based on the comparison.

2. The method of claim 1, wherein the predetermined impedance profile corresponds to a healthy battery pack, and wherein determining the status of the electrochemical energy storage device comprises determining the electrochemical energy storage device as not degraded in response to determining that the determined impedance profile of the electrochemical energy storage device is similar to the predetermined impedance profile corresponding to the healthy battery pack.

3. The method of claim 1, wherein the predetermined impedance profile corresponds to a degraded battery pack, and wherein determining the status of the electrochemical energy storage device comprises determining that the electrochemical energy storage device as degraded in response to determining that the determined impedance profile of the electrochemical energy storage device is similar to the predetermined impedance profile corresponding to the degraded battery pack.

4. The method of claim 3, further comprising recycling the electrochemical energy storage device in response to determining that the electrochemical energy storage device as degraded.

5. The method of claim 1, wherein the predetermined impedance profile corresponds to a healthy battery pack, and wherein determining the status of the electrochemical energy storage device comprises determining the electrochemical energy storage device as degraded in response to determining that the determined impedance profile of the electrochemical energy storage device is not similar to the predetermined impedance profile corresponding to the healthy battery pack.

6. The method of claim 1, wherein the predetermined impedance profile corresponds to a degraded battery pack, and wherein determining the status of the electrochemical energy storage device comprises determining that the electrochemical energy storage device as not degraded in response to determining that the determined impedance profile of the electrochemical energy storage device is not similar to the predetermined impedance profile corresponding to the degraded battery pack.

7. A status detector for determining a status of an electrochemical energy storage device, comprising:

a memory device; and a processing unit connected to the memory device, wherein the processing unit is operative to:

determine an impedance profile of an electrochemical energy storage device using an Electrochemical Impedance Spectroscopy (EIS) device, wherein the processing unit being configured to determine the impedance profile using the EIS device comprises the processing unit being configured to:

generate, using the EIS device a composite potential waveform comprising a combination of a plurality of sinusoidal potential waveforms at multiple different frequencies, apply, using the EIS device, the composite potential waveform across the electrochemical energy storage device, wherein the plurality of sinusoidal potential waveforms are applied simultaneously through the composite potential waveform, measure, using the EIS device, a corresponding output current at each of the multiple different frequencies resulting from the plurality of sinusoidal potential waveforms, determine, using the EIS device, an impedance of the electrochemical energy storage device at each of the multiple different frequencies from the plurality of sinusoidal potential waveforms and the corresponding output current, and determine the impedance profile comprising the impedance of the electrochemical energy storage device at each of the multiple different frequencies;

compare the determined impedance profile with a predetermined impedance profile; and determine a status of the electrochemical energy storage device based on the comparison.

8. The status detector of claim 7, wherein the predetermined impedance profile corresponds to a healthy battery pack, and wherein the processing unit being operative to determine the status of the electrochemical energy storage device comprises the processing unit being operative to determine the electrochemical energy storage device as not degraded in response to determining that the determined impedance profile of the electrochemical energy storage device is similar to the predetermined impedance profile corresponding to the healthy battery pack.

9. The status detector of claim 7, wherein the predetermined impedance profile corresponds to a degraded battery pack, and wherein the processing unit being operative to determine the status of the electrochemical energy storage device comprises the processing unit being operative to determine that the electrochemical energy storage device as degraded in response to determining that the determined impedance profile of the electrochemical energy storage device is similar to the predetermined impedance profile corresponding to the degraded battery pack.

10. The status detector of claim 7, wherein the predetermined impedance profile corresponds to a healthy battery pack, and wherein the processing unit being operative to determine the status of the electrochemical energy storage device comprises the processing unit being operative to determine the electrochemical energy storage device as degraded in response to determining that the determined impedance profile of the electrochemical energy storage device is not similar to the predetermined impedance profile corresponding to the healthy battery pack.

11. The status detector of claim 7, wherein the predetermined impedance profile corresponds to a degraded battery pack, and wherein the processing unit being operative to determine the status of the electrochemical energy storage device comprises the processing unit being operative to determine that the electrochemical energy storage device as not degraded in response to determining that the determined impedance profile of the electrochemical energy storage device is not similar to the predetermined impedance profile corresponding to the degraded battery pack.

12. A status detector for determining a status of an electrochemical energy storage device, the status detector comprising:

an Electrochemical Impedance Spectroscopy (EIS) device operative to:

generate a composite potential waveform comprising a combination of a sinusoidal potential at multiple different frequencies;

apply the composite potential waveform comprising the combination of the sinusoidal potential across an electrochemical energy storage device at the multiple different frequencies, and measure a corresponding output current for the sinusoidal potential at each of the multiple different frequencies, determine an impedance of the electrochemical energy storage device at each of the multiple different frequencies from the sinusoidal potential and the corresponding output current; and an impedance detector connected to the EIS device, wherein the impedance detector is operative to:

determine an impedance profile of the electrochemical energy storage device based on the sinusoidal potential and the corresponding output current, the impedance profile comprising the impedance of the electrochemical energy storage device at each of the multiple different frequencies, compare the impedance profile with a predetermined impedance profile, and determine a status of the electrochemical energy storage device based on the comparison.

13. The status detector of claim 12, wherein the predetermined impedance profile corresponds to a healthy battery pack, and wherein the impedance detector being operative to determine the status of the electrochemical energy storage device comprises the impedance detector being operative to determine the electrochemical energy storage device as not degraded in response to determining that the determined impedance profile of the electrochemical energy storage device is similar to the predetermined impedance profile corresponding to the healthy battery pack.

14. The status detector of claim 12, wherein the predetermined impedance profile corresponds to a degraded battery pack, and wherein the impedance detector being operative to determine the status of the electrochemical energy storage device comprises the impedance detector being operative to determine that the electrochemical energy storage device as degraded in response to determining that the determined impedance profile of the electrochemical energy storage device is similar to the predetermined impedance profile corresponding to the degraded battery pack.

15. The status detector of claim 12, wherein the predetermined impedance profile corresponds to a healthy battery pack, and wherein the impedance detector being operative to determine the status of the electrochemical energy storage device comprises the impedance detector being operative to determine the electrochemical energy storage device as degraded in response to determining that the determined impedance profile of the electrochemical energy storage device is not similar to the predetermined impedance profile corresponding to the healthy battery pack.

16. The status detector of claim 12, wherein the predetermined impedance profile corresponds to a degraded battery pack, and wherein the impedance detector being operative to determine the status of the electrochemical energy storage device comprises the impedance detector being operative to determine that the electrochemical energy storage device as not degraded in response to determining that the determined impedance profile of the electrochemical energy storage device is not similar to the predetermined impedance profile corresponding to the degraded battery pack.

17. The status detector of claim 12, wherein the electrochemical energy storage device comprises a rechargeable battery.

18. The status detector of claim 12, wherein the EIS device being operative to apply the sinusoidal potential across the electrochemical energy storage device at the multiple frequencies comprises the EIS device being operative to apply the sinusoidal potential across the electrochemical energy storage device at least three frequencies.

* * * * *